United States Patent
Ohnishi et al.

(10) Patent No.: US 7,582,970 B2
(45) Date of Patent: Sep. 1, 2009

(54) CARBON CONTAINING SILICON OXIDE FILM HAVING HIGH ASHING TOLERANCE AND ADHESION

(75) Inventors: Sadayuki Ohnishi, Kawasaki (JP); Kouichi Owto, Kawasaki (JP); Tatsuya Usami, Kawasaki (JP); Noboru Morita, Kawasaki (JP); Kouji Arita, Kawasaki (JP); Ryouhei Kitao, Kawasaki (JP); Youichi Sasaki, Kawasaki (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 12/180,652

(22) Filed: Jul. 28, 2008

(65) Prior Publication Data

US 2008/0290522 A1    Nov. 27, 2008

Related U.S. Application Data

(62) Division of application No. 11/477,011, filed on Jun. 28, 2006, now Pat. No. 7,420,279, which is a division of application No. 10/767,230, filed on Jan. 29, 2004, now Pat. No. 7,102,236.

(30) Foreign Application Priority Data

Jan. 29, 2003 (JP) .............................. 2003-021078
Jan. 27, 2004 (JP) .............................. 2004-018080

(51) Int. Cl.
    *H01L 23/48* (2006.01)
(52) U.S. Cl. .................. 257/758; 257/759; 257/760; 257/E21.261; 257/E21.277
(58) Field of Classification Search ............... 257/758, 257/759, 760, E21.261, E21.277
    See application file for complete search history.

(56) References Cited

U.S. PATENT DOCUMENTS

| | | | |
|---|---|---|---|
| 5,783,452 | A | 7/1998 | Jons et al. |
| 6,054,379 | A | 4/2000 | Yau et al. |
| 6,071,810 | A | 6/2000 | Wada et al. |
| 6,159,871 | A | 12/2000 | Loboda et al. |
| 6,485,815 | B1 | 11/2002 | Jeong et al. |
| 6,506,680 | B1 | 1/2003 | Kim et al. |
| 6,555,461 | B1 | 4/2003 | Woo et al. |
| 6,686,285 | B2 | 2/2004 | Miyajima et al. |
| 6,764,774 | B2 | 7/2004 | Grill et al. |
| 6,858,539 | B2 | 2/2005 | Minamihaba et al. |

FOREIGN PATENT DOCUMENTS

| | | |
|---|---|---|
| JP | 2001326224 | 11/2001 |
| JP | 2001345317 | 12/2001 |

(Continued)

OTHER PUBLICATIONS

Japanese Office Action for corresponding Japanese Application dated Dec. 26, 2006.

*Primary Examiner*—Andy Huynh
(74) *Attorney, Agent, or Firm*—Katten Muchin Rosenman LLP

(57) ABSTRACT

A semiconductor device includes an interlayer insulating film formed on or over a semiconductor substrate. An opening is formed in the interlayer insulating film and reaches a lower layer metal wiring conductor. A metal plug is formed by filling the opening with Cu containing metal via a barrier metal. The interlayer insulating film includes the insulating film which includes a carbon containing silicon oxide (SiOCH) film which has Si—CH2 bond in the carbon containing silicon oxide film. The proportion of Si—CH2 bond (1360 cm-1) to Si—CH3 bond (1270 cm-1) in the insulating film is in a range from 0.03 to 0.05 measured as a peak height ratio of FTIR spectrum.

7 Claims, 12 Drawing Sheets

FOREIGN PATENT DOCUMENTS

| | | |
|---|---|---|
| JP | 2002-110670 | 4/2002 |
| JP | 2002252228 | 9/2002 |
| JP | 2002-299337 | 10/2002 |
| JP | 2002-329718 | 11/2002 |
| JP | 2003-017561 | 1/2003 |
| JP | 2004-534373 | 11/2004 |

FIG. 2A
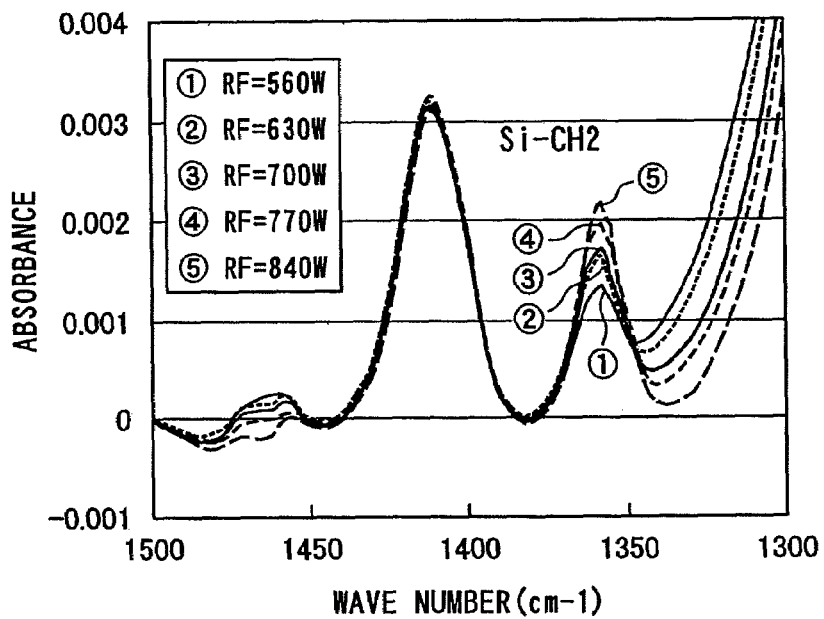
FIG. 2B
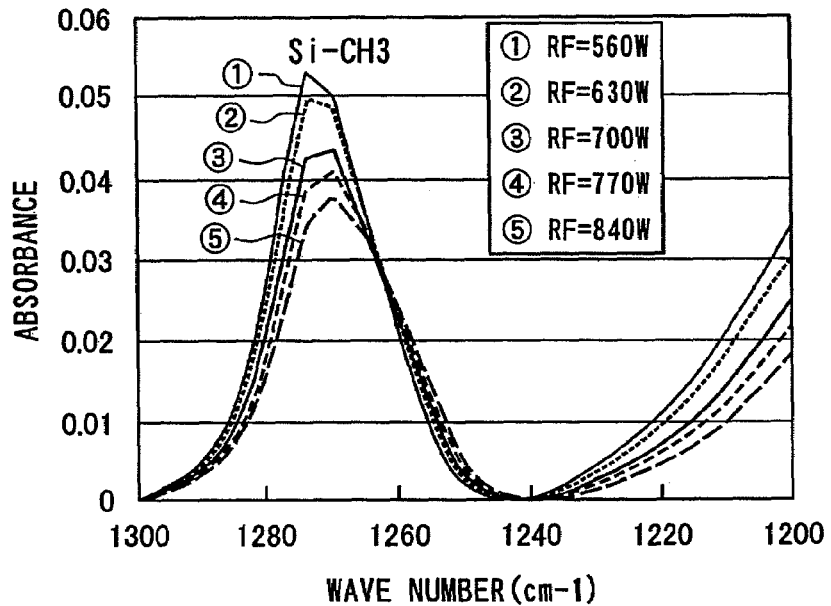
FIG. 2C
| RF POWER | Si-CH2/Si-CH3 |
|---|---|
| 560W | 0.0245 |
| 630W | 0.0305 |
| 700W | 0.0395 |
| 770W | 0.0487 |
| 840W | 0.0594 |

FIG. 5

|  |  | Si-CH2/Si-CH3 RATIO |
|---|---|---|
| O2 FLOW RATE | ↘ | ↗ |
| RF POWER | ↗ | ↗ |
| PRESSURE | ↘ | ↗ |
| TEMPERATURE | ↗ | ↗ |

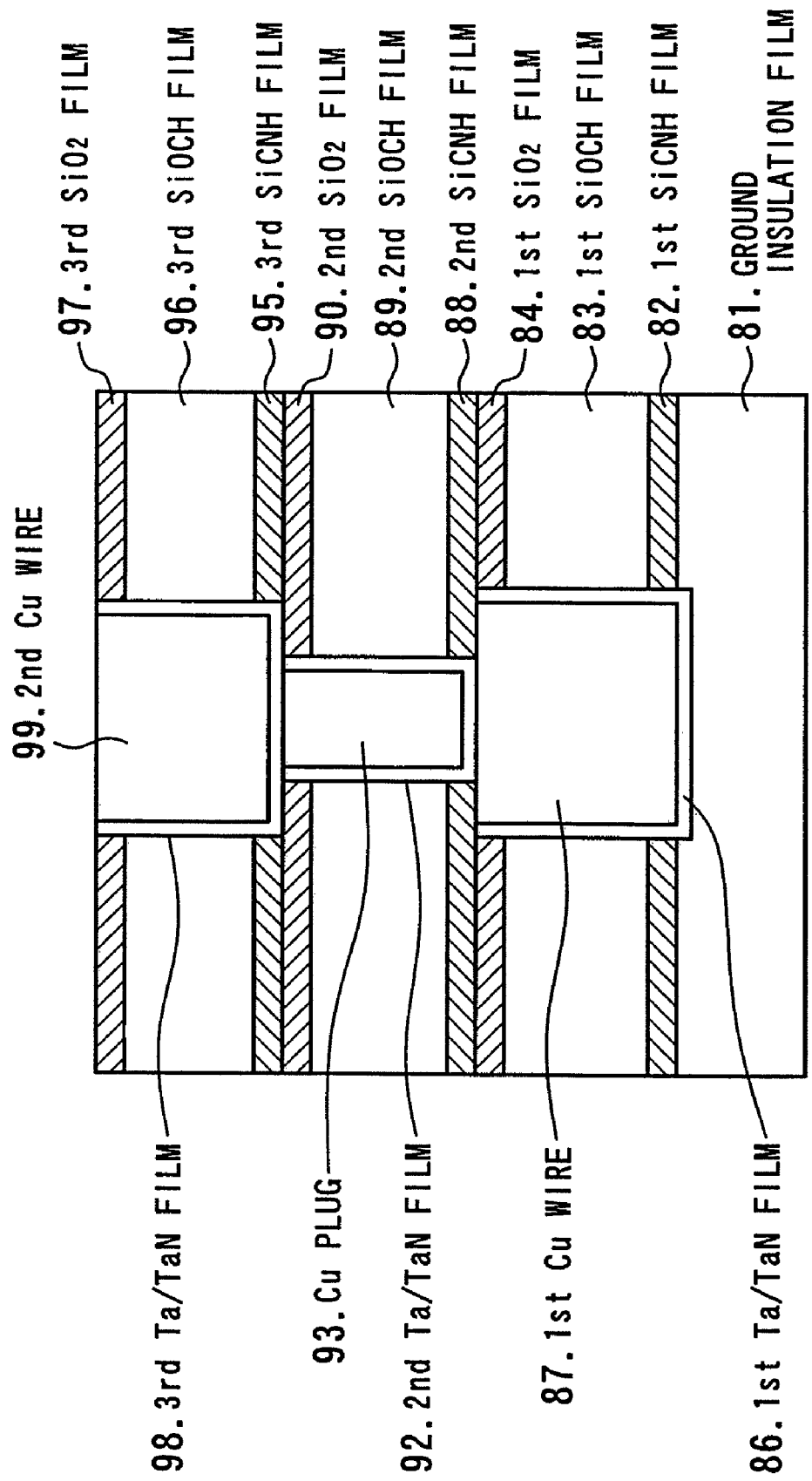

85. WIRING TRENCH

CARBON CONTAINING SILICON OXIDE FILM HAVING HIGH ASHING TOLERANCE AND ADHESION

CROSS REFERENCE TO RELATED APPLICATIONS

This application is a divisional application of and claims priority to U.S. Ser. No. 11/477,011, which was filed on Jun. 28, 2006 and which is now pending. U.S. Ser. No. 11/477,011 is a divisional application of and claims priority to U.S. Ser. No. 10/767,230, which was filed on Jan. 29, 2004, now U.S. Pat. No. 7,102,236. U.S. Ser. No. 10/767,230 claims priority to Japanese Patent Application JP 2003-021078 filed Jan. 29, 2003 and Japanese Patent Application 2004-018080 filed Jan. 27, 2004. All aforementioned application are hereby incorporated by reference in their entirety for all purposes.

FIELD OF THE INVENTION

The present invention relates generally to an insulating film having a low dielectric constant, and more particularly to an insulating film having a low dielectric constant which is used, for example, as an interlayer insulating film of a semiconductor device.

BACKGROUND OF THE INVENTION

Recently, according to an increase in demand for higher integration degree of a semiconductor device, a multi-layer wiring technology has become of much note. In the multi-layer wiring structure, a bottleneck against high speed operation of elements is capacitance between wires. In order to decrease the capacitance between wires, it is necessary to reduce the dielectric constant (or relative dielectric constant) of an interlayer insulating film.

Conventionally, a silicon dioxide ($SiO_2$) film is generally used. Recently, however, other insulating film materials having lower dielectric constant are energetically developed. The conventional silicon dioxide film is formed by adding oxygen $O_2$ or nitrous oxide $N_2O$ as oxidizing agent to material gas such as $SiH_4$, $Si(OC_2H_5)_4$ and the like, and by using a plasma enhanced CVD method and the like. The dielectric constant of silicon dioxide obtained in this way is approximately 4.0. On the other hand, it is reported that a carbon containing silicon oxide (SiOCH) film, which is formed by using methyl silane based precursor (for example, trimethyl silane or tetramethyl silane) as material gas and which is formed by using a plasma enhanced CVD method, has the dielectric constant of 3 or lower. In the SiOCH film, $CH_3$ group as an end group is introduced into —O—Si—O— network, thereby reducing the density to decrease the dielectric constant thereof. For example, see page 3, column 2 through page 4, column 4 of the specification of U.S. Pat. No. 6,159,871, and page 11, column 4 through page 16, column 14 of the specification of U.S. Pat. No. 6,054,379.

However, the $CH_3$ groups contained in the SiOCH film are often destructed in the $O_2$ ashing process when trenches and vias are formed in the film. Therefore, the SiOCH film is susceptible to deterioration of film quality such as film contraction, moisture absorption and the like. This is because, the $CH_3$ group is located in the end portion of the —O—Si—O— network, and easily reacts with O ions and radicals in the ashing atmosphere.

At present, in developing next generation devices, an effort is energetically performed to further reduce the dielectric constant by making the SiOCH film porous. However, when the SiOCH film becomes porous, the above-mentioned ashing damage becomes prominent. Also, in the via-first method which is most typical among the dual-damascene processes for forming wiring structure, side walls of the through holes (vias) formed in the process of the method are exposed to the ashing processes twice when the vias are formed and when the trenches are formed. When the side walls of the vias are deteriorated due to the ashing damage and moisture absorption becomes large, deterioration of yield of vias becomes large.

Further, when the SiOCH film is patterned, an $SiO_2$ film (CAP—$SiO_2$ film) is formed on the SiOCH film as a mask for patterning. However, adhesion of the SiOCH film with the CAP—$SiO_2$ film is lower than that of the conventional film such as an $SiO_2$ film, an SiON film, an SiN film, an HSQ film and the like. This is because, the $CH_3$ groups contained in the film is hydrophobic, and affinity thereof with the $SiO_2$ film is relatively low.

SUMMARY OF THE INVENTION

Therefore, it is an object of the present invention to provide an insulating film which can be used as an interlayer insulating film of a semiconductor device and in which ashing tolerance of the insulating film can be improved without causing a rise in dielectric constant of the insulating film.

It is another object of the present invention to provide an insulating film which can be used as an interlayer insulating film of a semiconductor device and which has improved adhesion with an $SiO_2$ film.

It is still another object of the present invention to provide a semiconductor device having an interlayer insulating film in which ashing tolerance of the interlayer insulating film can be improved without causing a rise in dielectric constant of the insulating film.

It is still another object of the present invention to provide a semiconductor device having an interlayer insulating film in which the interlayer insulating film has improved adhesion with an $SiO_2$ film.

It is still another object of the present invention to obviate the disadvantages of the conventional insulating film and the semiconductor device using the conventional insulating film.

According to an aspect of the present invention, there is provided an insulating film comprising a carbon containing silicon oxide (SiOCH) film which has Si—$CH_2$ bond in the carbon containing silicon oxide film.

According to another aspect of the present invention, there is provided a semiconductor device having an interlayer insulating film formed on or over a semiconductor substrate and a metal wiring conductor which is formed by filling a wiring trench formed in the interlayer insulating film with Cu containing metal via a barrier metal, wherein the interlayer insulating film includes the insulating film comprising a carbon containing silicon oxide (SiOCH) film which has Si—$CH_2$ bond in the carbon containing silicon oxide film.

According to still another aspect of the present invention, there is provided a semiconductor device having an interlayer insulating film formed on or over a semiconductor substrate, an opening which is formed in the interlayer insulating film and which reaches a lower layer metal wiring conductor, and a metal plug which is formed by filling the opening with Cu containing metal via a barrier metal, wherein the interlayer insulating film includes the insulating film comprising a carbon containing silicon oxide (SiOCH) film which has Si—$CH_2$ bond in the carbon containing silicon oxide film.

According to still another aspect of the present invention, there is provided a semiconductor device having an interlayer insulating film formed on or over a semiconductor substrate, a wiring trench formed in the interlayer insulating film, an opening which is formed in the interlayer insulating film and which reaches a lower layer metal wiring conductor from the bottom portion of the wiring trench, and a metal wiring conductor and metal plug which are formed by filling the wiring trench and the opening with Cu containing metal via a barrier metal, wherein the interlayer insulating film includes the insulating film comprising a carbon containing silicon oxide (SiOCH) film which has Si—CH2 bond in the carbon containing silicon oxide film.

In the above, it is preferable that the proportion of Si—CH2 bond (1360 cm-1) to Si—CH3 bond (1270 cm-1) in the insulating film is in a range from 0.03 to 0.05 measured as a peak height ratio of FTIR spectrum.

It is also preferable that the relative dielectric constant of the insulating film is equal to or lower than 3.1.

It is further preferable that the carbon containing silicon oxide (SiOCH) film is formed by using plasma enhanced CVD process.

It is advantageous that the carbon containing silicon oxide (SiOCH) film comprises methylsilsesquioxane.

It is also advantageous that, as a portion of the interlayer insulating film, an SiO2 film is formed on the upper layer portion of the insulating film.

It is further advantageous that, as a portion of the interlayer insulating film, an insulating film for preventing metal diffusion is formed on the lower layer portion of the insulating film.

It is preferable that the Cu containing metal contains, in addition to Cu, at least one of Si, Al, Ag, W, Mg, Be, Zn, Pd, Cd, Au, Hg, Pt, Zr, Ti, Sn, Ni and Fe.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which:

FIG. 2A is a graph showing the RF power dependence of FT-IR characteristics of insulating films according to the present invention, and especially showing peak curves of Si—CH2 in FT-IR spectra of SiOCH films formed in various RF power conditions;

FIG. 2B is a graph showing the RF power dependence of FT-IR characteristics of insulating films according to the present invention, and especially showing peak curves of Si—CH3 in FT-IR spectra of SiOCH films formed in various RF power conditions;

FIG. 2C is a table showing ratios of Si—CH2 to Si—CH3 of SiOCH films formed in various RF power conditions;

FIG. 5 is an illustration showing relationships between parameters concerning various film forming conditions and Si—CH2/Si—CH3 bond ratio;

FIG. 6 is a cross sectional view showing a semiconductor device according to an embodiment of the present invention;

DESCRIPTION OF A PREFERRED EMBODIMENT

With reference to the drawings, embodiments of the present invention will now be described.

Embodiment 1

Figure 1:
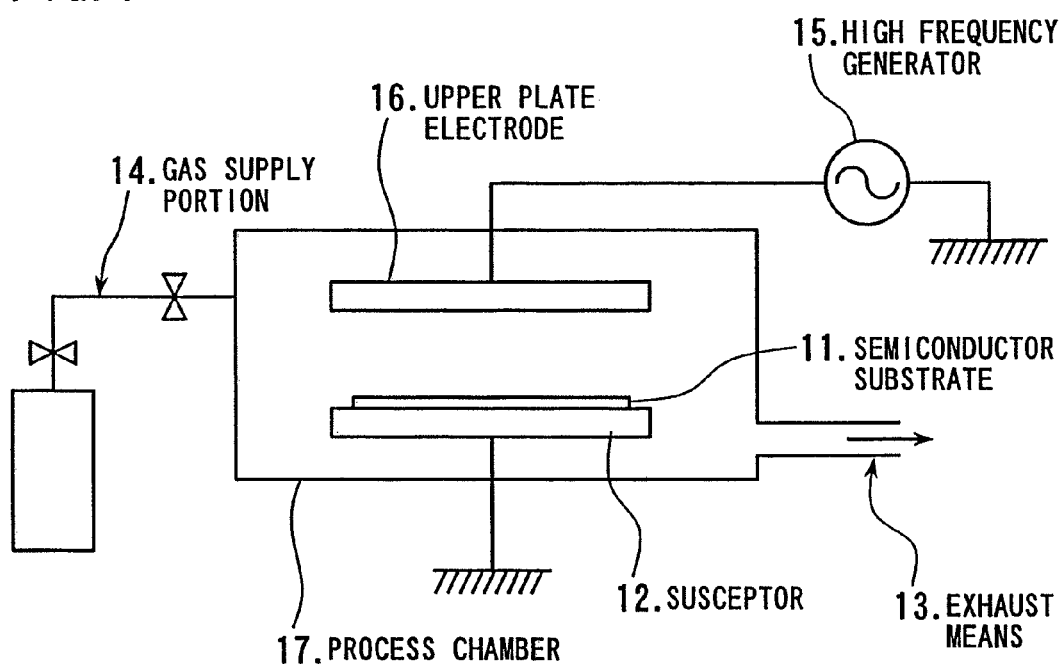
FIG. 1 is a schematic view illustrating a plasma enhanced CVD system used for forming an insulating film according to the present invention.

In this embodiment, an explanation will be made on a method of forming an insulating film according to the present invention, that is, an SiOCH film having Si—CH2 bond in the film, on a semiconductor substrate. FIG. 1 illustrates a schematic structure of a parallel plate electrode type plasma enhanced CVD apparatus which can be used for forming the SiOCH film according to the present invention.

The apparatus shown in FIG. 1 comprises a processing chamber 17 within which film forming process is performed on a semiconductor substrate 11, and a susceptor 12 which is disposed in the processing chamber 17 and which functions as a lower plate electrode. The susceptor 12 has a heater for heating a semiconductor substrate 11 placed on the susceptor 12 and for keeping the temperature of the semiconductor substrate 11 constant. The apparatus shown in FIG. 1 also comprises a transporting means (not shown in the drawing) for carrying the semiconductor substrate 11 into the processing chamber 17 and for carrying the semiconductor substrate 11 out of the processing chamber 17. The apparatus shown in FIG. 1 further comprises an exhaust means 13 which keeps the pressure in the processing chamber 17 constant, a gas supply portion 14 which supplies a plurality of kinds of reaction gases into the processing chamber 17, and a high frequency signal generator 15.

Within the processing chamber 17, there are provided an upper plate electrode 16 and the susceptor 12 as a lower plate electrode in opposed dispositions. The upper plate electrode 16 is electrically coupled with the high frequency signal generator 15 mentioned above. Also, the susceptor 12 has the heater mentioned above which is built therein. The high frequency signal generator 15 generates and supplies a high frequency power (RF power) signal, which has a predetermined frequency and a predetermined high frequency power, between the upper plate electrode 16 and the susceptor 12 as the lower plate electrode.

When the SiOCH film is formed by using the plasma enhanced CVD apparatus which has the above-mentioned structure, the semiconductor substrate 11 placed on the susceptor 12 is heated to a desired temperature by the heater built in the susceptor 12. Also, predetermined kinds of reaction gases are supplied into the processing chamber 17 at predetermined flow rates, thereby a desired gas atmosphere and a desired processing pressure are realized within the processing chamber 17. A high frequency RF power signal having a desired frequency is applied between the upper plate electrode 16 and the susceptor 12, and plasma of reaction gases is produced within the processing chamber 17. Thereby, the SiOCH film is formed on the semiconductor substrate 11.

Next, a detailed explanation will be made on a method of forming the SiOCH film by using the above-mentioned plasma enhanced CVD apparatus. In this embodiment, trimethyl silane and oxygen were used as source gases to form the SiOCH film. In a typical film forming condition, a film forming temperature is 350☐, and source gases comprise trimethyl silane at a flow rate of 1100 sccm and oxygen (O2) at a flow rate of 450 sccm. Also, an RF power is 700 W, and a pressure is 4.5 Torr.

Also, the inventors formed SiOCH films having various film characteristics, by changing these film forming conditions, i.e., RF power, gas flow rate, temperature and pressure, and measured the film characteristics. As a result thereof, the inventors found that there are close relationships between the proportion of Si—CH2 bond (1360 cm-1) to Si—CH3 bond (1270 cm-1) in each film in Fourier Transform Infrared Spectroscopy (FTIR) spectrum and film characteristics. That is, in a film which has Si—CH2 bond, as the Si—CH2 bond/Si—CH3 bond ratio becomes higher, ashing tolerance and adhesion become improved, and also dielectric constant becomes larger. On the other hand, as the Si—CH2 bond/Si—CH3 bond ratio becomes lower, a change in each of these parameters shows an opposite tendency.

FIGS. 2A through 2C show peak curves of Si—CH2 in FTIR spectra, peak curves of Si—CH3 in FTIR spectra, and ratios of Si—CH2 to Si—CH3 calculated from these peak curves, respectively, concerning SiOCH films formed in various conditions in which RF powers are changed from 560 W through 630 W, 700 W, 770 W and 840 W.

FIG. 2A shows peaks of Si—CH2 bond having a wave number of 1360 cm-1 in FTIR spectra. From FIG. 2A, it can be seen that, as the RF power becomes large, Si—CH2 bond increases.

FIG. 2B shows peaks of SiCH3 bond having a wave number of 1270 cm-1 in FTIR spectra. From FIG. 2B, it can be seen that, as the RF power becomes large, Si—CH3 bond decreases.

FIG. 2C is a table showing a result of ratios of Si—CH2 to Si—CH3 calculated from these peak curves. From FIG. 2C, it can be seen that, as the RF power increases, the ratios of Si—CH2 bond to Si—CH3 bond increase.

With respect to the samples of SiOCH films obtained in this way and having the ratios of Si—CH2 bond to Si—CH3 bond shown in FIG. 2C, ashing tolerance and adhesion to the SiO2 film (CAP—SiO2 film) which is formed as the upper layer on the SiOCH film were examined.

Figure 3:
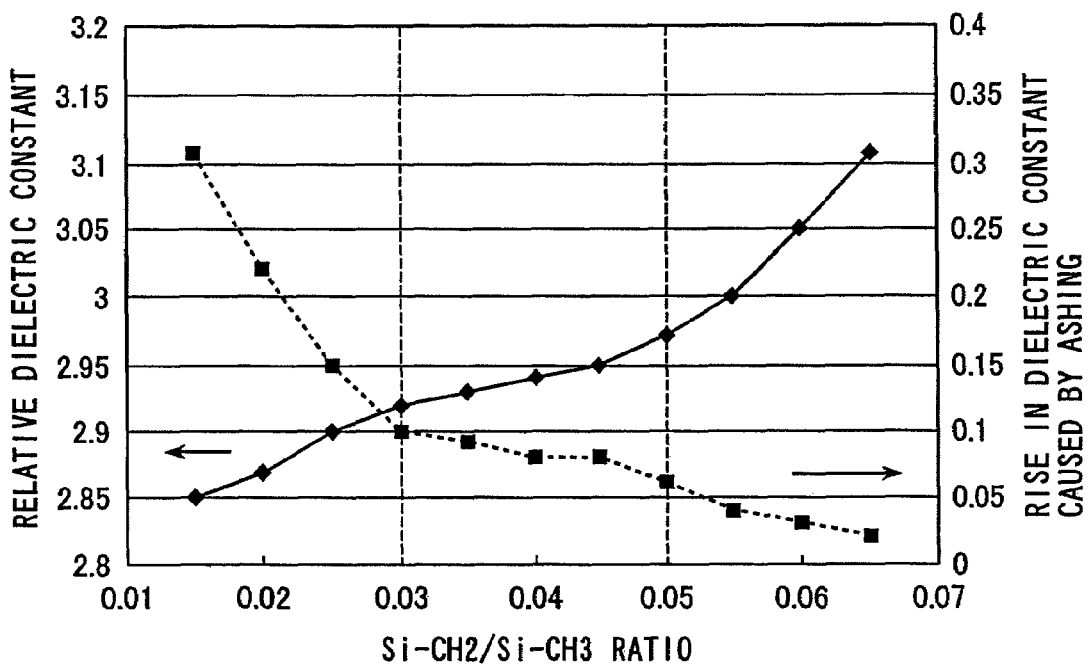
FIG. 3 is a graph showing relationships between Si—CH2/Si—CH3 bond ratio and relative dielectric constant, and between Si—CH2/Si—CH3 bond ratio and a rise in dielectric constant caused by ashing, in an insulating film according to the present invention.

With respect to the ashing tolerance, a parallel plate type O2 ashing apparatus was used, and ashing process was performed in the following conditions. That is, flow rate of ashing gas, O2, was 500 sccm, RF power was 1000 W, process time was 60 seconds, and process temperature was 100☐. FIG. 3 shows: relative dielectric constant of SiOCH film before the ashing process in ordinate of left side; and increase in relative dielectric constant of SiOCH film after the ashing process in ordinate of right side; with respect to the ratios of Si—CH2 to Si—CH3 shown by the abscissa. From FIG. 3, it can be seen that, as Si—CH2 bond increases, ashing tolerance is improved. On the other hand, as the Si—CH3 group decreases, the relative dielectric constant increases. It can be seen that, in a range of Si—CH2/Si—CH3 ratio from 0.03 to 0.05, relative dielectric constant is 3 or lower and increase in the relative dielectric constant caused by ashing becomes 0.1 or lower. That is, in this range, it is possible to keep the relative dielectric constant of SiOCH film equal to or lower than 3.1, even after performing the ashing process.

Figure 4:
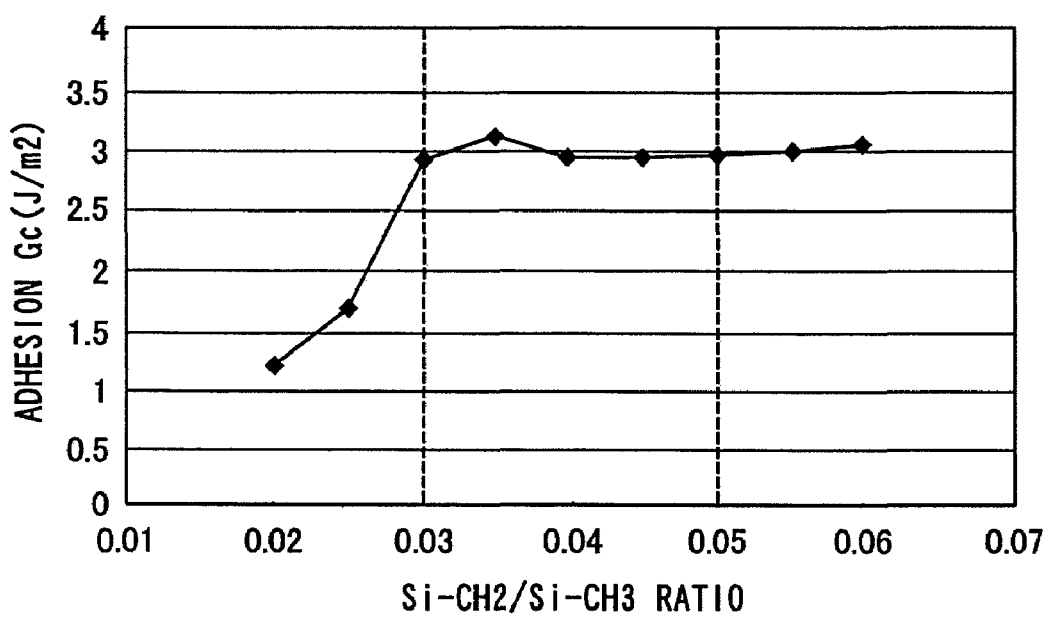
FIG. 4 is a graph showing a relationship between Si—CH2/Si—CH3 bond ratio and adhesion, in an insulating film according to the present invention.

FIG. 4 shows a relationship between an adhesion of a CAP—SiO2 film and an Si—CH2/Si—CH3 ratio, measured by using a four point bending method. From FIG. 4, it can be seen that, when the Si—CH2/Si—CH3 ratio becomes high, the adhesion becomes improved. This is because, when the Si—CH2/Si—CH3 ratio becomes high, CH3 groups which are hydrophobic groups decrease, and Si—CH2 bonds hide in —Si—O— network, so that affinity for SiO2 film increases. Therefore, from the point of view of adhesion, it is preferable that the Si—CH2 bond/Si—CH3 bond ratio is high. However, when the Si—CH2 bond/Si—CH3 bond ratio becomes high, dielectric constant also increases. Therefore, it is preferable that the Si—CH2 bond/Si—CH3 bond ratio is in a range from 0.03 to 0.05.

In the above, an explanation was made on an example in which RF power was changed to change Si—CH2 bond/Si—CH3 bond ratio. FIG. 5 shows relationships between various parameters in forming the film and Si—CH2 bond/Si—CH3 bond ratio. From FIG. 5, it can be seen that, when O2 flow rate is relatively low, when a pressure is relatively low and when a temperature is relatively high, the Si—CH2 bond/Si—CH3 bond ratio becomes high. Therefore, by optimizing these parameters, it is possible to form a SiOCH film having the Si—CH2 bond/Si—CH3 bond ratio of 0.03-0.05.

By using the method mentioned above, it is possible to form an insulating film according to the present invention, that is, an SiOCH film having Si—CH2 bond within the film. In this case, it is preferable that the Si—CH2 bond/Si—CH3 bond ratio is in a range between 0.03 and 0.05, and, by using the ratio in this range, it is possible to keep the relative dielectric constant of the SiOCH film equal to or lower than 3.1 even after performing ashing.

Also, in the above, an explanation was made on a method of forming the SiOCH film by using a plasma enhanced CVD apparatus. However, by using methylsilsesquioxane (MSQ) formed by coating and by controlling base material, it is also possible to form an SiOCH film which has Si—CH2 bond within the film, in which the Si—CH2 bond/Si—CH3 bond ratio is in a range between 0.03 and 0.05, and in which the relative dielectric constant of the SiOCH film can be kept equal to or lower than 3.1 even after ashing.

Embodiment 2

An explanation will now be made on a second embodiment of the present invention. In the second embodiment, an SiOCH film according to the present invention is applied to a single damascene wiring structure.

FIG. 6 is a cross sectional view illustrating a semiconductor device according to the second embodiment of the present invention. In FIG. 6, reference numeral 81 designates a ground insulating film formed on a semiconductor substrate (not shown in the drawing) on which semiconductor elements such as transistors, capacitors and the like (not shown in the drawing) are formed. On the ground insulating film 81, a first interlayer insulating film is formed which comprises, from a lower layer to an upper layer, a first SiCNH film 82, a first SiOCH film 83, and a first SiO2 film (i.e., first CAP—SiO2 film) 84. The first SiCNH film 82 is formed as an anti metal diffusion insulating film for preventing diffusion of metal such as Cu and the like, and has a film thickness of 50 nm. The first SiOCH film 83 is a film which has a film thickness of 250 nm, and which has Si—CH2 bond therein and Si—CH2 bond/Si—CH3 bond ratio thereof is preferably 0.03-0.05. The first SiO2 film 84 has a film thickness of 100 nm.

In a wiring trench formed in the first interlayer insulating film, a first Cu wiring conductor 87 is formed via a first Ta/TaN film 86. The first Ta/TaN film 86 is formed as a barrier metal layer and has a film thickness of 30 nm. The first Cu wiring conductor 87 is a first metal wiring conductor which comprises Cu as Cu containing metal.

On the upper surface of the first SiO2 film 84 and the first Cu wiring conductor 87, a second interlayer insulating film is formed which comprises, from a lower layer to an upper layer, a second SiCNH film 88, a second SiOCH film 89, and a second SiO2 film (i.e., second CAP—SiO2 film) 90. The second SiCNH film 88 is formed as an anti metal diffusion insulating film for avoiding diffusion of metal, and has a film thickness of 50 nm. The second SiOCH film 89 is a film which has a film thickness of 250 nm, and which has Si—CH2 bond therein and Si—CH2 bond/Si—CH3 bond ratio thereof is preferably 0.03-0.05. The second SiO2 film 90 has a film thickness of 100 nm.

In the second interlayer insulating film, there is formed an opening (i.e., a via) which penetrates through the second interlayer insulating film and which reaches the first Cu wiring conductor 87, that is, the lower layer metal wiring conductor. In the opening, there is formed a Cu plug 93 via a second Ta/TaN film 92. The second Ta/TaN film 92 is formed as a barrier metal layer and has a film thickness of 30 nm. The Cu plug 93 is a metal plug which comprises Cu as Cu containing metal.

On the upper surface of the second SiO2 film 90 and the Cu plug 93, a third interlayer insulating film is formed which comprises, from a lower layer to an upper layer, a third SiCNH film 95, a third SiOCH film 96, and a third SiO2 film (i.e., third CAP—SiO2 film) 97. The third SiCNH film 95 is formed as an anti metal diffusion insulating film for avoiding diffusion of metal, and has a film thickness of 50 nm. The third SiOCH film 96 is a film which has a film thickness of 250 nm, and which has Si—CH2 bond therein and Si—CH2 bond/Si—CH3 bond ratio thereof is preferably 0.03-0.05. The third SiO2 film 97 has a film thickness of 100 nm.

In the third interlayer insulating film, there is formed a wiring trench which penetrates through the third interlayer insulating film and which reaches the Cu plug 93 of the lower layer. In the wiring trench, there is formed a second Cu wiring conductor 99 via a third Ta/TaN film 98. The third Ta/TaN film 98 is formed as a barrier metal layer and has a film thickness of 30 nm. The second Cu wiring conductor 99 is a second metal wiring conductor which comprises Cu as Cu containing metal.

Next, an explanation will be made on a method of manufacturing a single damascene wiring structure shown in FIG. 6 to which SiOCH films according to the present invention are applied. FIGS. 7A-7D are cross sectional views each illustrating, in order of process steps, a workpiece of a semiconductor device according to the second embodiment obtained during a process of manufacturing thereof.

Figure 7A:
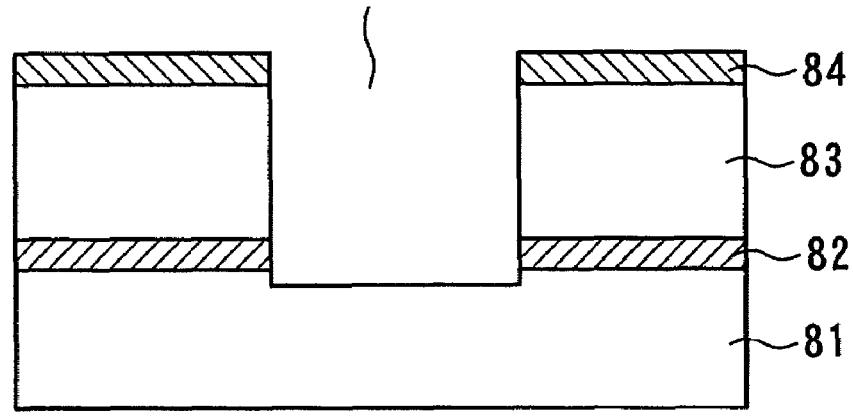
FIGS. 7A-7D are cross sectional views illustrating in order a process of forming the semiconductor device shown in FIG. 6.

With reference to FIG. 7A, first, on a ground insulating film 81 formed on a semiconductor substrate (not shown in the drawing) on which semiconductor elements such as transistors, capacitors and the like (not shown in the drawing) are formed, a first SiCNH film 82 is formed by using a plasma enhanced CVD method to a film thickness of 50 nm. Then, also by using a plasma enhanced CVD method, a first SiOCH film 83 is formed to a film thickness of 250 nm. The first SiOCH film 83 has Si—CH2 bond therein and Si—CH2 bond/Si—CH3 bond ratio thereof is preferably 0.03-0.05. Thereafter, the first SiO2 film (i.e., first CAP—SiO2 film) 84 is formed by using a plasma enhanced CVD method to a film thickness of 100 nm. In this process, process temperature is 200-450□, N2O gas flow rate is 100-6000 sccm, SiH4 gas flow rate is 10-1000 sccm, process pressure is 1-20 Torr, and RF power is 50-500 W. It is also possible to form the first SiO2 film 84 in the same vacuum chamber as that used for forming the first SiOCH film 83, continuously after forming the first SiOCH film 83. By the process steps mentioned above, the first interlayer insulating film comprising three layers is formed which comprises, from a lower layer to an upper layer, the first SiCNH film 82, the first SiOCH film 83, and the first SiO2 film 84.

Next, by using a photolithography technology and a dry etching technology, a wiring trench 85 is formed which penetrates through the first SiO2 film 84, the first SiOCH film 83 and the first SiCNH film 82, as clearly shown in FIG. 7A.

Figure 7B:
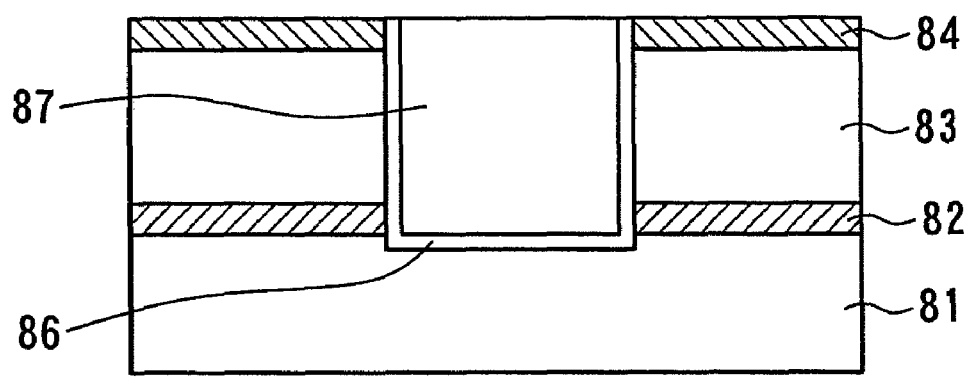

With reference to FIG. 7B, on an exposed inside wall of the wiring trench 85 and on the upper surface of the first SiO2 film 84, a Ta/TaN film 86 is formed to a film thickness of 30 nm. On the Ta/TaN film 86, a Cu layer is formed to a film thickness of 100 nm by using a sputtering method. The Cu layer is used as a cathode side ground layer for an electrolytic plating method. Thereafter, the wiring trench 85 is filled with Cu by using an electrolytic plating method. Further, a heat treatment is performed thereafter at a temperature of 100-400□ for crystallization. Then, the Cu layer and the Ta/TaN film 86 on the first SiO2 insulating film 84 are removed by a CMP method. Thereby, the first Cu wiring conductor 87 is formed within the wiring trench 85, as clearly shown in FIG. 7B.

Figure 7C:
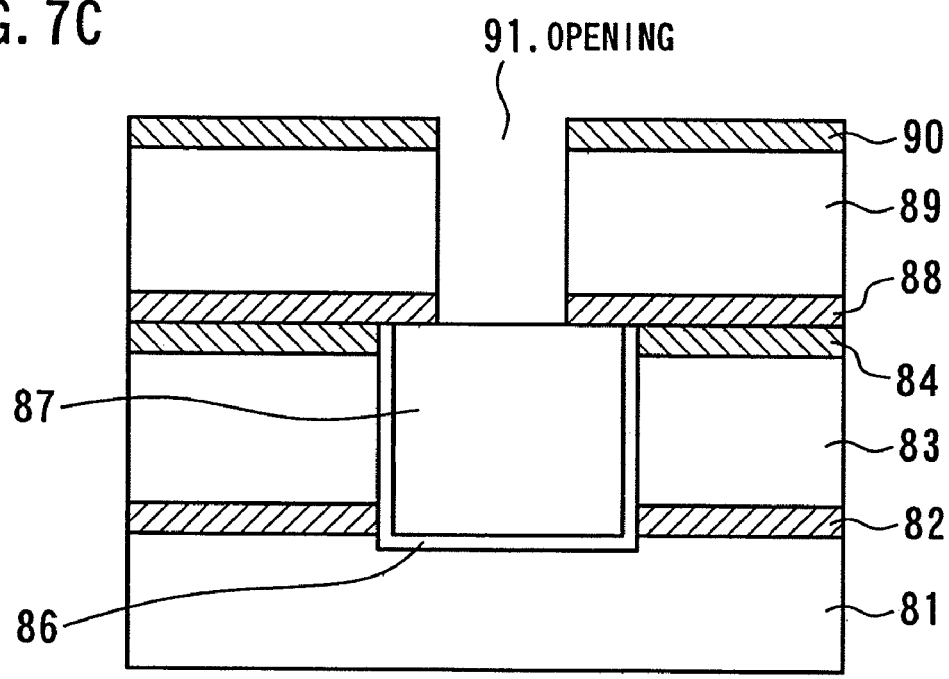

With reference to FIG. 7C, a second interlayer insulating film is formed on the workpiece obtained by the process mentioned above. That is, by using a procedure similar to that mentioned above, a second SiCNH film 88 is formed to a film thickness of 50 nm. Then, by using a plasma enhanced CVD method, a second SiOCH film 89 is formed to a film thickness of 250 nm which has Si—CH2 bond therein and Si—CH2 bond/Si—CH3 bond ratio thereof is preferably 0.03-0.05. Further, a second SiO2 film (a second CAP—SiO2 film) 90 is formed to a film thickness of 100 nm.

By using a photolithography technology and a dry etching technology, there is formed an opening (i.e., a via) 91 which penetrates through the second interlayer insulating film and which reaches the first Cu wiring conductor 87, as clearly shown in FIG. 7C.

Figure 7D:
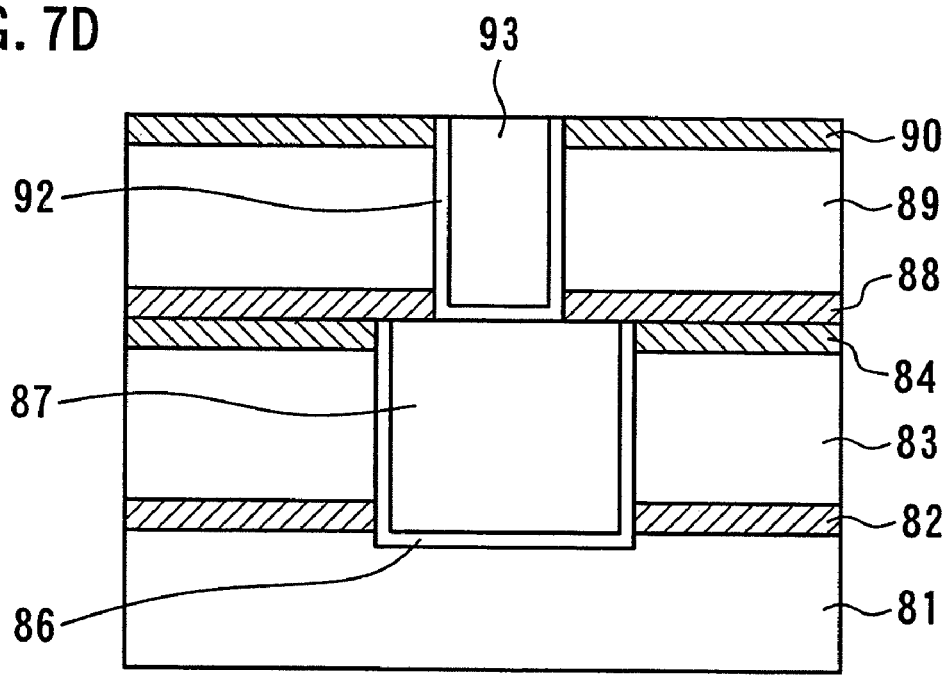

With reference to FIG. 7D, on an inside wall of the opening 91 and on the upper surface of the second SiO2 film 90, a second Ta/TaN film 92 is formed to a film thickness of 30 nm. On the second Ta/TaN film 92, a Cu layer is formed to a film thickness of 100 nm by using a sputtering method. The Cu layer is used as a cathode side ground layer for an electrolytic plating method. Thereafter, the opening 91 is filled with Cu by using an electrolytic plating method. Further, a heat treatment is performed at a temperature of 100-400□ for crystallization. Then, the Cu layer and the Ta/TaN film 92 on the second SiO2 insulating film 90 are removed by a CMP method. Thereby, a Cu plug 93 is formed within the opening 91 as a metal plug, as clearly shown in FIG. 7D.

Thereafter, referring back again to FIG. 6, a third interlayer insulating film is formed on the workpiece obtained as mentioned above. That is, by using a procedure similar to that mentioned above, a third SiCNH film 95 is formed to a film thickness of 50 nm. Then, by using a plasma enhanced CVD method, a third SiOCH film 96 is formed to a film thickness of 250 nm which has Si—CH2 bond therein and Si—CH2 bond/

Si—CH3 bond ratio thereof is preferably 0.03-0.05. Further, a third SiO2 film (a third CAP—SiO2 film) 97 is formed to a film thickness of 100 nm.

By using a photolithography technology and a dry etching technology, there is formed a wiring trench which penetrates through the third interlayer insulating film and which connects at a portion thereof to the Cu plug 93 of lower layer. Next, in a manner similar to the method mentioned above, on an inside wall of the wiring trench and on the upper surface of the third SiO2 film 97, a third Ta/TaN film 98 is formed, and on the third Ta/TaN film 98, a Cu layer is formed. The Cu layer is used as a cathode side ground layer for an electrolytic plating method. Thereafter, the wiring trench is filled with Cu by using an electrolytic plating method. Further, a heat treatment is performed at a temperature of 100-400□ for crystallization. Then, the Cu layer and the Ta/TaN film 98 on the third SiO2 insulating film 97 are removed by a CMP method. Thereby, a second Cu wiring conductor 99 is formed within the wiring trench. By the process mentioned above, the two layer wiring structure having a single damascene structure was formed.

Figure 8:
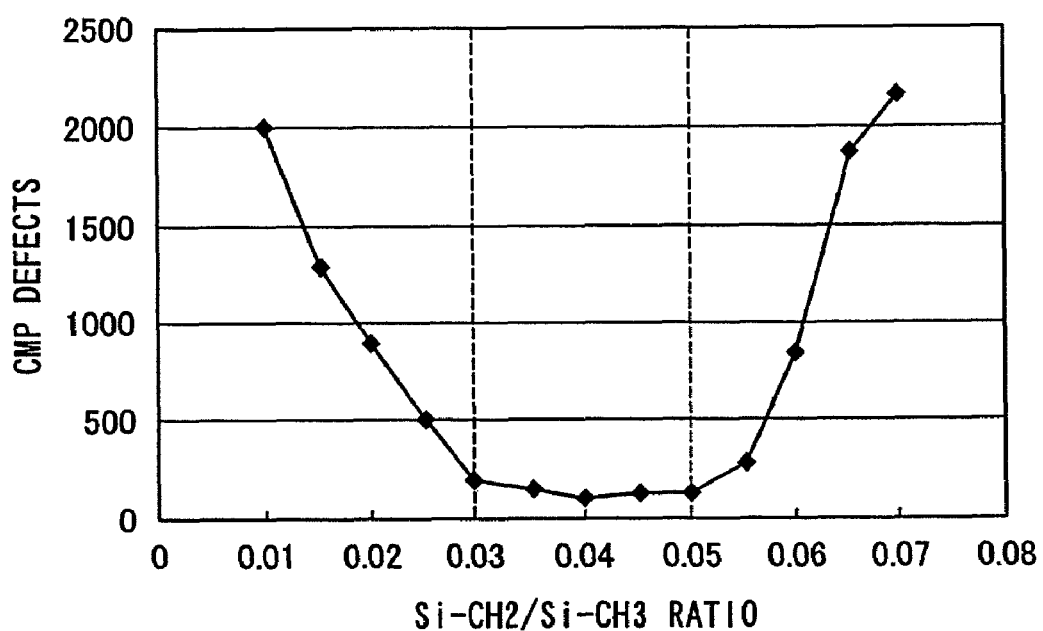
FIG. 8 is a graph showing a relationship between Si—CH2/Si—CH3 bond ratio and defects after a CMP process of an insulating film in the embodiment of the present invention shown in FIG. 6.

FIG. 8 shows a relationship between a number of defects of Cu portion after performing a CMP process and a film composition, i.e., Si—CH2/Si—CH3 ratio, of a SiOCH film which is used as an interlayer insulating film, when the above-mentioned Cu wiring conductor is formed. From FIG. 8, it can be seen that, as the proportion of Si—CH2 bond to Si—CH3 bond becomes large, the number of CMP defects once decreases, and, as the proportion of Si—CH2 bond further becomes large, the number of CMP defects increases again. This is because, as shown in FIG. 4 before, when the proportion of Si—CH2 bond becomes large, the proportion of Si—CH3 bond which deteriorates adhesion decreases, and adhesion between CAP—SiO2 film and SiOCH film is improved, so that delamination of CAP—SiO2 film caused by CMP process decreases and defects of Cu decreases. When the proportion of Si—CH2 bond further increases, —CH2— bond is introduced into —O—Si—O— bond, so that the film strength deteriorates and the number of defects again increases. Therefore, in order to keep the number of defects small, it is preferable that the Si—CH2 bond/Si—CH3 bond ratio of the SiOCH film is in a range from 0.03 to 0.05. When the Si—CH2 bond/Si—CH3 bond ratio is in this range, it is also possible to suppress disadvantages such as the delamination of CAP—SiO2 film when fabricating the device and the like can be avoided.

Embodiment 3

An explanation will now be made on a third embodiment of the present invention. In the third embodiment, a dual damascene wiring structure is formed by using an interlayer insulating film according to the present invention.

FIGS. 9A-9D are cross sectional views each illustrating, in order of process steps, a workpiece of a semiconductor device according to the third embodiment of the present invention obtained during a process of manufacturing thereof.

Figure 9A:
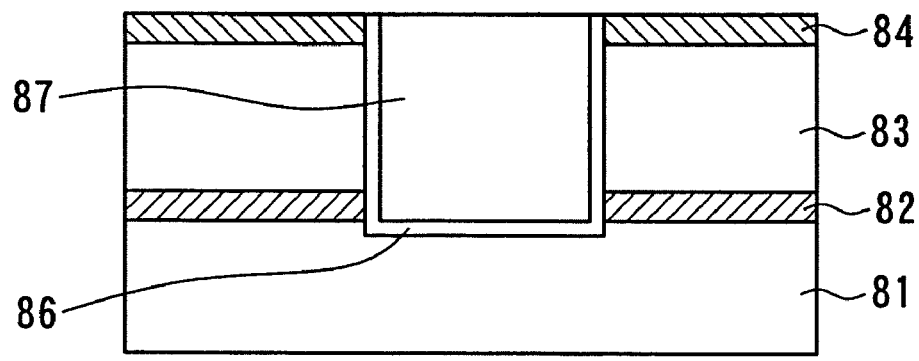
FIGS. 9A-9D are cross sectional views illustrating in order a process of forming a semiconductor device according to another embodiment of the present invention.

With reference to FIG. 9A, first, on a ground insulating film 81 formed on a semiconductor substrate (not shown in the drawing) on which semiconductor elements such as transistors, capacitors and the like (not shown in the drawing) are formed, a first interlayer insulating film comprising three layers designated by reference numerals 82, 83 and 84 are formed in this order from a lower layer to an upper layer, by using process steps similar to those mentioned above with respect to the second embodiment. That is, as an anti metal diffusion insulating film for preventing diffusion of metal, a first SiCNH film 82 is formed to a film thickness of 50 nm. Then, a first SiOCH film 83 is formed to a film thickness of 250 nm. Thereafter, the first SiO2 film (i.e., first CAP—SiO2 film) 84 is formed to a film thickness of 100 nm.

Next, within a wiring trench formed such that the wiring trench penetrates through the first interlayer insulating film, a first Cu wiring conductor 87 which is a first metal wiring conductor is formed via a first barrier metal Ta/TaN film 86.

Figure 9B:
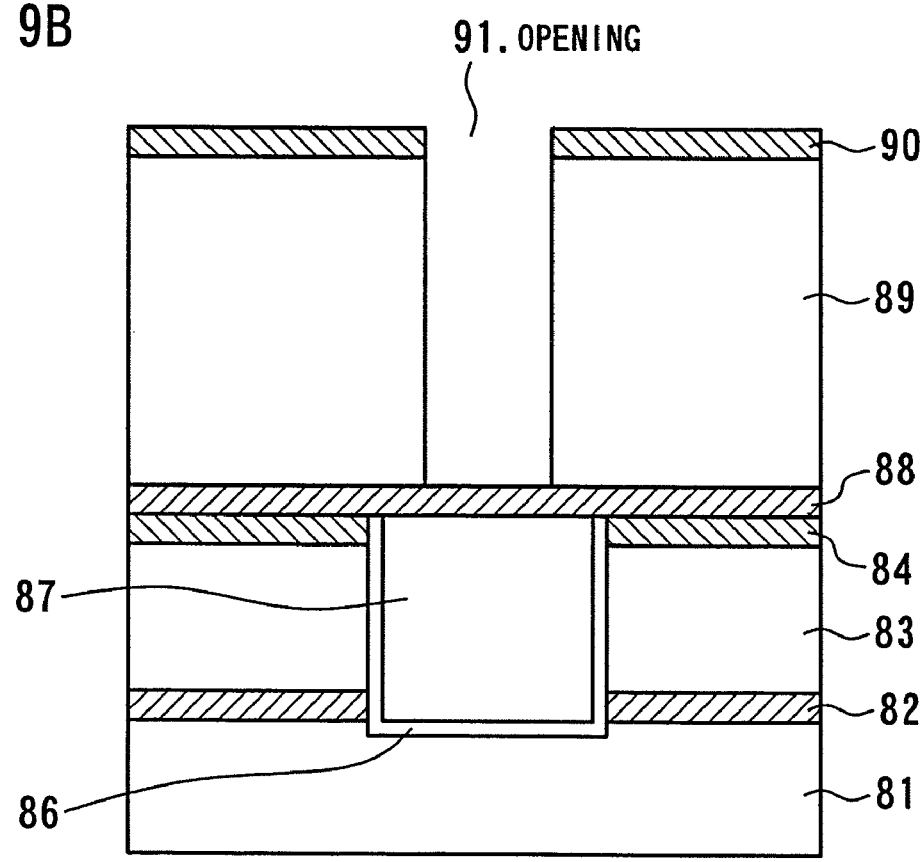

With reference to FIG. 9B, a second interlayer insulating film comprising three layers 88, 89 and 90 is formed on the SiO2 film 84 and the upper surface of the first Cu wiring conductor 87. That is, a second SiCNH film 88 as an anti metal diffusion insulating film is formed to a film thickness of 50 nm. Then, by using a plasma enhanced CVD method, a second SiOCH film 89 is formed to a film thickness of 500 nm which has Si—CH2 bond therein and Si—CH2 bond/Si—CH3 bond ratio thereof is preferably 0.03-0.05. Thereafter, a second SiO2 film (a second CAP—SiO2 film) 90 is formed to a film thickness of 100 nm.

By using a photolithography technology and a dry etching technology, there is formed an opening 91 from the surface of the second SiO2 film 90 until it reaches the second SiCNH film 88, as clearly shown in FIG. 9B.

Figure 9C:
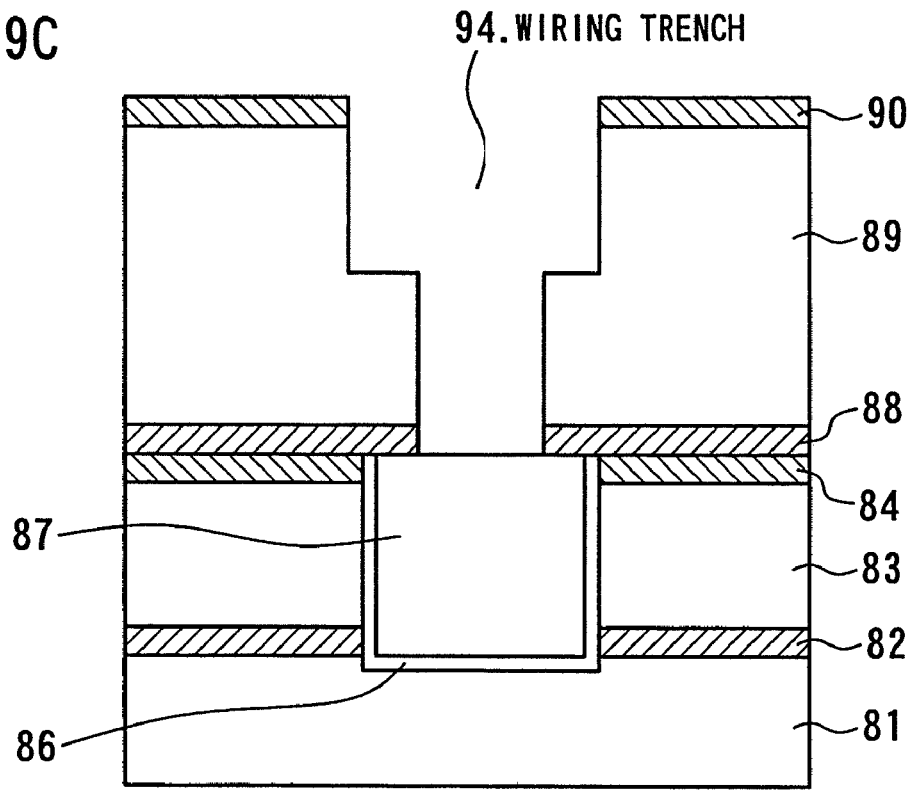
Figure 9D:
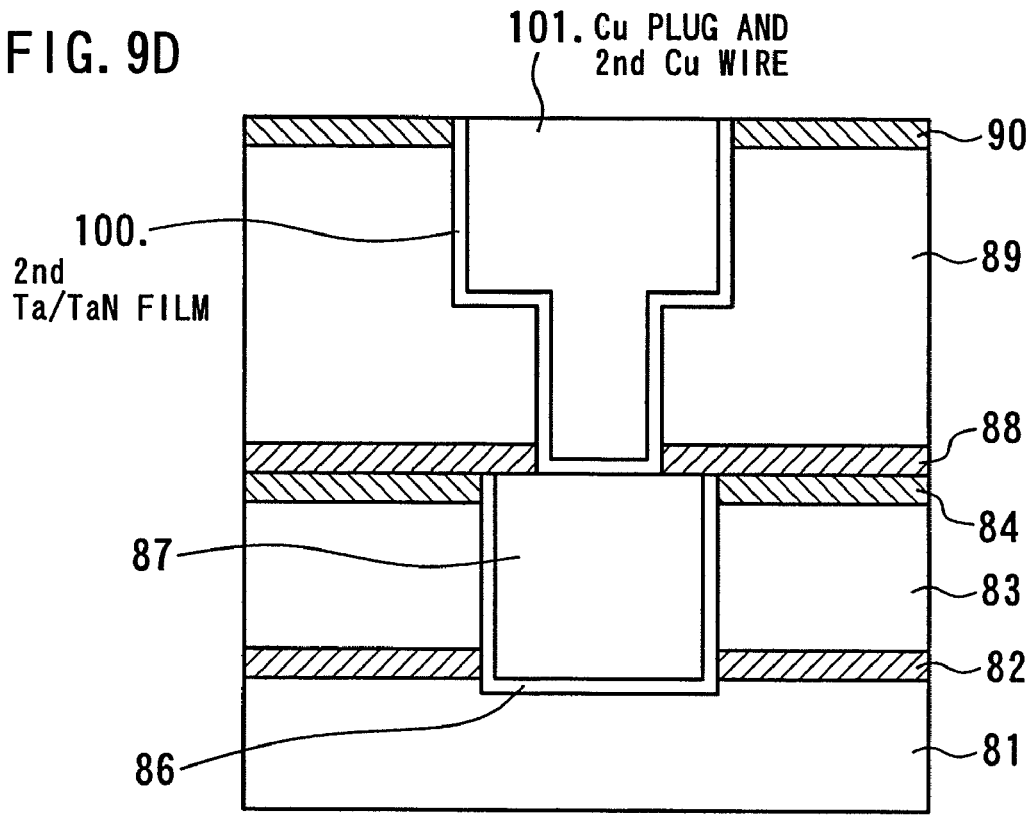

Next, with reference to FIG. 9C, by using a photolithography technology and a dry etching technology, there is formed a wiring trench 94 in an area including the opening 91. Also, a portion of the SiCNH film 88 at the bottom portion of the opening 91 is opened, such that the opening 91 reaches the upper surface of the first Cu wiring conductor 87 which becomes a lower layer metal wiring conductor. In this case, the wiring trench 94 is formed halfway through the thickness of the second SiOCH film 89.

Next, on an inside wall of the opening 91 and the wiring trench 94 and on the upper surface of the second SiO2 film 90, a second Ta/TaN film 100 is formed as a barrier metal layer to a film thickness of 30 nm. On the second Ta/TaN film 100, a Cu layer is formed to a film thickness of 100 nm by using a sputtering method. The Cu layer is used as a Cu containing metal which becomes a cathode side ground layer for an electrolytic plating method. Thereafter, the opening 91 and the wiring trench are filled with Cu as the Cu containing metal by using an electrolytic plating method. Further, a heat treatment is performed at a temperature of 100-400□ for crystallization. Then, the Cu layer and the Ta/TaN film on the second SiO2 insulating film 90 are removed by a CMP method. Thereby, Cu plug and second Cu wiring conductor (designated by a common reference numeral 101) are simultaneously formed as metal plug and second metal wiring conductor. In this way, a two layer wiring conductor formed by Cu and having a dual damascene structure is formed, as clearly shown in FIG. 9D.

Figure 10:
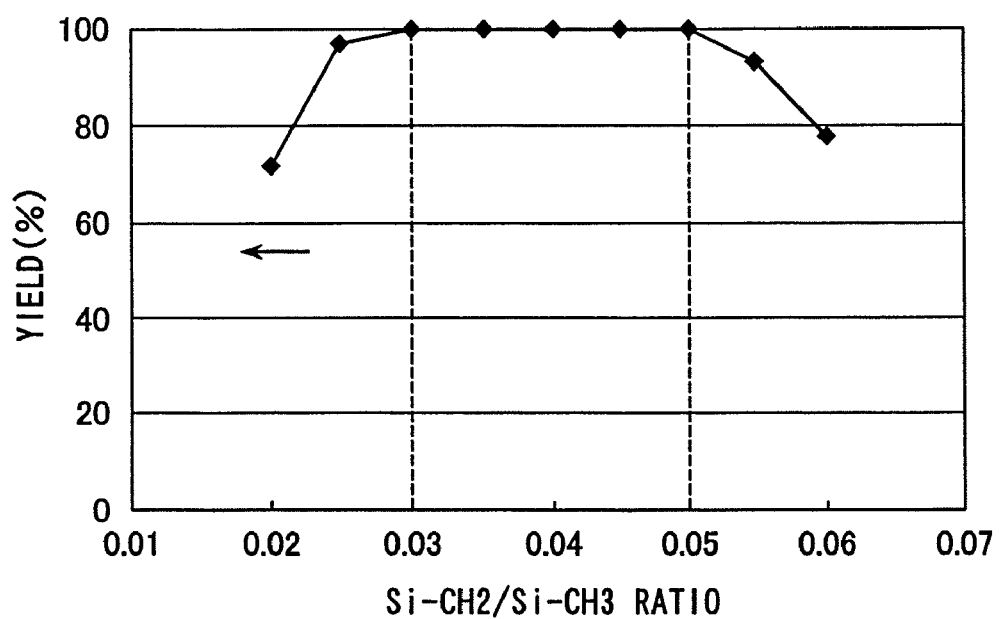
FIG. 10 is a graph showing a relationship between Si—CH2/Si—CH3 bond ratio and yield of an insulating film in the embodiment of the present invention shown in FIGS. 9A-9D.

FIG. 10 shows a relationship between the yield from 1,000,000 via chains of two layer Cu wiring conductors and the Si—CH2/Si—CH3 ratio of an SiOCH film which is used as an interlayer insulating film, when the Cu two layer wiring conductors are formed in accordance with the above-mentioned dual damascene method. From FIG. 10, it can be seen that, as the Si—CH2 bond/Si—CH3 bond ratio becomes small, the yield becomes small. This is because, in such case, ashing tolerance deteriorates, and, therefore, outgassing of moisture and the like from the side surface of via forming portion increases, so that via is not completely filled with Cu and the like. On the other hand, when the Si—CH2 bond/Si—CH3 bond ratio is too high, the yield becomes small. It is considered that when the Si—CH2 bond/Si—CH3 bond ratio is too high, the film strength deteriorates so that the interlayer insulating film is damaged when CMP process is performed.

Therefore, in order to obtain high yield, it is preferable that the Si—CH2 bond/Si—CH3 bond ratio of the SiOCH film is in a range from 0.03 to 0.05.

In the above description, an explanation was made on a method of forming a dual damascene wiring structure, by using a via-first technology in which a wiring trench is formed after forming an opening (i.e., a via). However, the present invention is not limited to such method. For example, the present invention can also be applied to a trench-first method in which an opening (i.e., a via) is formed after forming a wiring trench. It is also possible to use a middle-first method in which an SiCH film or an SiCNH film which functions as an etching stopper layer is inserted into the second SiOCH film, and, after processing the etching stopper layer first, a wiring trench and a via opening are simultaneously formed.

Further, in the second and third embodiments mentioned above, the Cu containing metal which constitutes the metal wiring conductor (metal wire) and the metal plug was Cu, that is, the metal wiring conductor was a Cu wiring conductor and the metal plug was a Cu plug. However, the Cu containing metal can be a Cu containing metal which contains, in addition to Cu, at least one of: Si, Al, Ag, W, Mg, Be, Zn, Pd, Cd, Au, Hg, Pt, Zr, Ti, Sn, Ni and Fe. In case the Cu containing metal contains these materials, it is possible to further improve the life of wiring conductors in a semiconductor device which has the structure according to the present invention.

According to the above-mentioned constitution of the present invention, an insulating film is provided which is a carbon containing oxide silicon (SiOCH) film and which has —Si—CH2—bond in the film. Therefore, it becomes possible to improve ashing tolerance, without causing a rise in the dielectric constant of the interlayer insulating film which especially requires low dielectric constant. Also, as described before with reference to FIG. 4, it is possible to improve adhesion to the CAP—SiO2 film.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as falling within the scope of the appended claims.

What is claimed is:

1. A semiconductor device comprising:
an interlayer insulating film formed on or over a semiconductor substrate,
an opening which is formed in the interlayer insulating film and which reaches a lower layer metal wiring conductor, and
a metal plug which is formed by filling the opening with Cu containing metal via a barrier metal,
wherein the interlayer insulating film includes the insulating film comprising a carbon containing silicon oxide (SiOCH) film which has Si—CH2 bond in the carbon containing silicon oxide film, and
wherein the proportion of Si—CH2 bond (1360 cm-1) to Si—CH3 bond (1270 cm-1) in the insulating film is in a range from 0.03 to 0.05 measured as a peak height ratio of FTIR spectrum.

2. A semiconductor device as set forth in claim 1, wherein the relative dielectric constant of the insulating film is equal to or lower than 3.1.

3. A semiconductor device as set forth in claim 1, wherein the carbon containing silicon oxide (SiOCH) film is formed by using plasma enhanced CVD process.

4. A semiconductor device as set forth in claim 1, wherein the carbon containing silicon oxide (SiOCH) film comprises methylsilsesquioxane.

5. A semiconductor device as set forth in claim 1, wherein, as a portion of the interlayer insulating film, an SiO2 film is formed on the upper layer portion of the insulating film.

6. A semiconductor device as set forth in claim 1, wherein, as a portion of the interlayer insulating film, an insulating film for preventing metal diffusion is formed on the lower layer portion of the insulating film.

7. A semiconductor device as set forth in claim 1, wherein the Cu containing metal contains, in addition to Cu, at least one of Si, Al, Ag, W, Mg, Be, Zn, Pd, Cd, Au, Hg, Pt, Zr, Ti, Sn, Ni and Fe.

* * * * *